United States Patent
Dietrich et al.

(12) 
(10) Patent No.: US 6,396,755 B2
(45) Date of Patent: May 28, 2002

(54) INTEGRATED MEMORY WITH ROW ACCESS CONTROL TO ACTIVATE AND PRECHARGE ROW LINES, AND METHOD OF OPERATING SUCH A MEMORY

(75) Inventors: Stefan Dietrich, Türkenfeld; Sabine Schöniger, Hausham; Peter Schrögmeier; Christian Weis, both of München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/864,978

(22) Filed: May 24, 2001

(30) Foreign Application Priority Data

May 24, 2000 (DE) .......................................... 100 25 569

(51) Int. Cl.$^7$ .............................. G11C 7/00; G11C 8/00
(52) U.S. Cl. .................... 365/203; 365/230.06; 365/233
(58) Field of Search ........................... 365/203, 230.06, 365/233

(56) References Cited

U.S. PATENT DOCUMENTS 5,555,526 A    9/1996  Kim
6,130,843 A  * 10/2000  Lee .............................. 365/203
6,141,276 A  * 10/2000  Mullarkey et al. .......... 365/203

* cited by examiner

*Primary Examiner*—Trong Phan
(74) *Attorney, Agent, or Firm*—Laurence A. Greenberg; Werner H. Stemer; Greory L. Mayback

(57) ABSTRACT

An integrated memory has memory cells which are each connected to a row line to select one of the memory cells and to a column line to read or write a data signal. A row access controller is used to activate one of the row lines to select one of the memory cells and to control a precharging operation to precharge one of the row lines. A precharge command initiates a precharging operation. The precharging operation for an activated row line is triggered by the row access controller when the reading or writing of a data signal has been finished and when a defined time interval, during which the row line must at least be activated, has elapsed since the activation. As a result, a precharging operation of the activated row line is controlled in a self-adjusting manner. A method of operating an integrated memory is also provided.

12 Claims, 2 Drawing Sheets

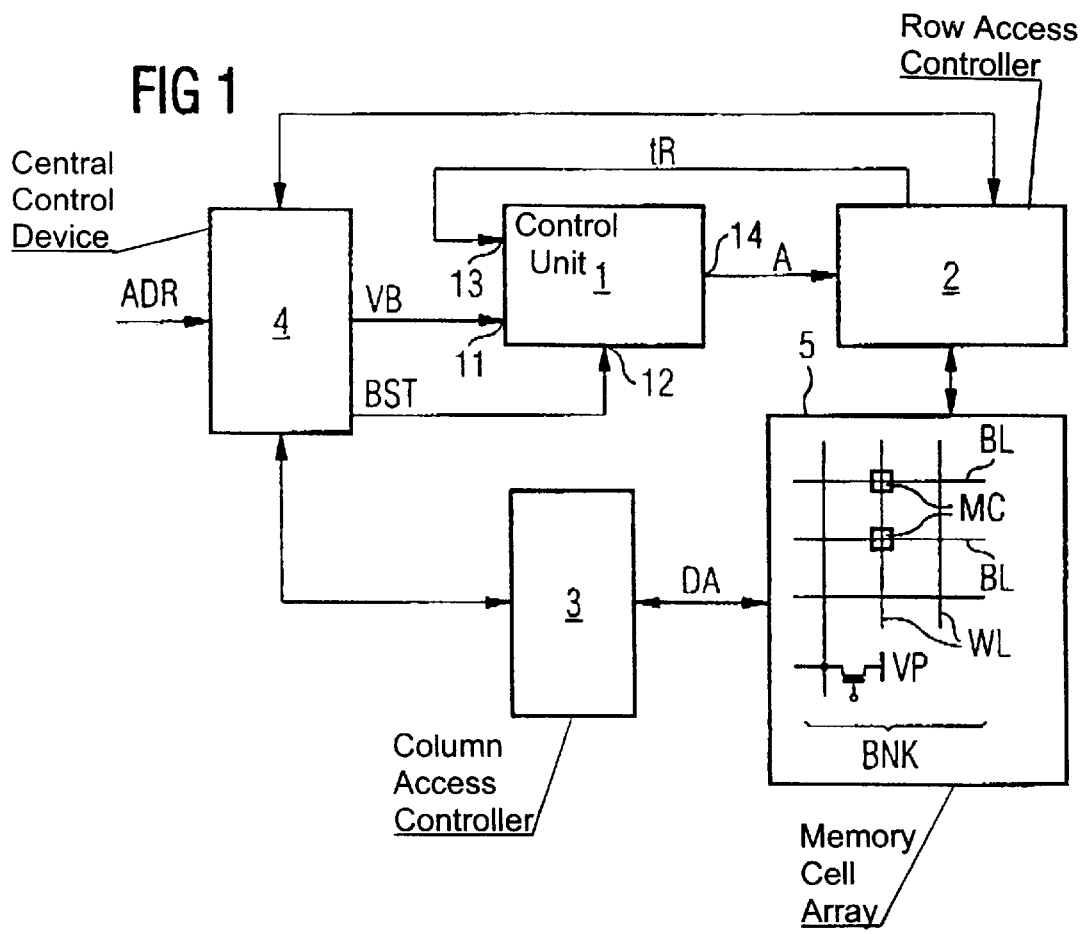
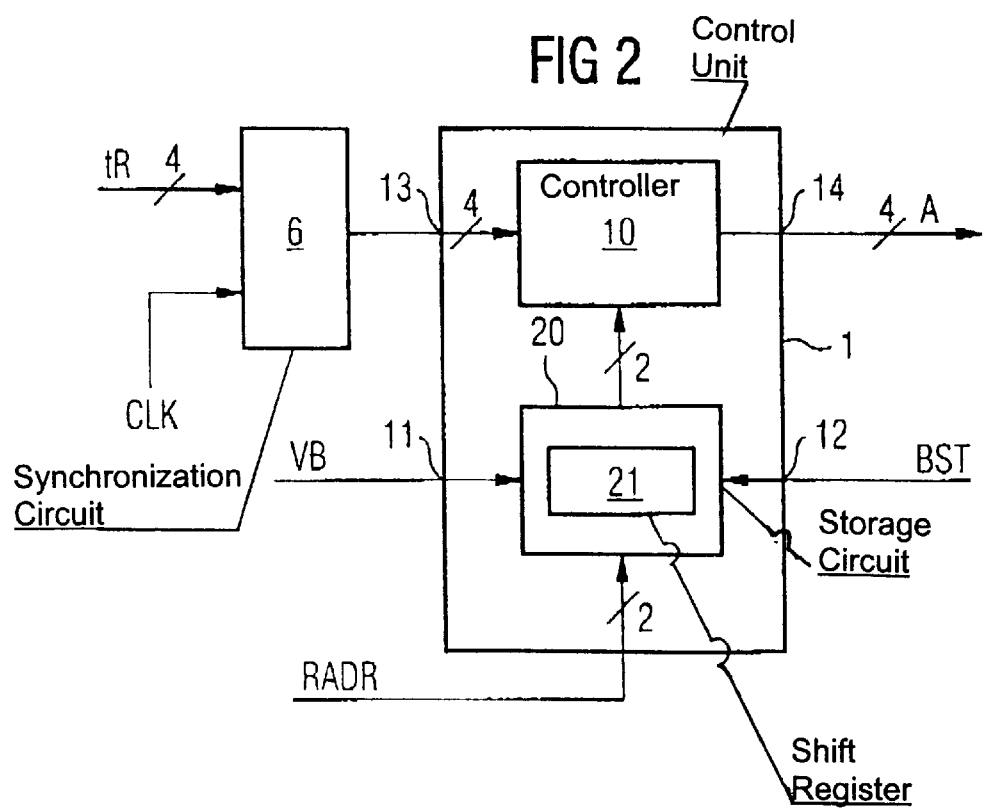

INTEGRATED MEMORY WITH ROW ACCESS CONTROL TO ACTIVATE AND PRECHARGE ROW LINES, AND METHOD OF OPERATING SUCH A MEMORY

BACKGROUND OF THE INVENTION

Field of the Invention

The invention relates to an integrated memory having a memory cell array. The memory cell array has column lines, row lines, and memory cells which are each connected to one of the row lines to select one of the memory cells and to one of the column lines to read or write a data signal. The integrated memory has a row access controller to activate one of the row lines to select one of the memory cells and to control a precharging operation to precharge one of the row lines. The invention also relates to a method of operating such a memory.

An integrated memory generally has a memory cell array which includes column lines and row lines. In this case, the memory cells are provided at crossing points of the column lines and row lines. In order to select one of the memory cells, the latter are in each case connected to one of the row lines. To this end, for example, a select transistor of respective memory cells is turned on by an activated row line, such that it is then possible for a data signal to be read from or written to a corresponding selected memory cell. To this end, the selected memory cell is connected to one of the column lines, via which the corresponding data signal is read or written.

In an inactive state, the row lines are normally precharged to a precharge potential. This means that, after a data signal has been read or written, the corresponding activated row line is precharged to the precharge potential again by a precharging operation. The control of this precharging operation, and also the activation of one of the row lines for the selection of one of the memory cells, is generally carried out through the use of a row access controller.

In particular in the case of synchronous memories, such as so-called SDRAM (Synchronous Dynamic Random Access Memory) or SGRAM (Synchronous Graphics Random Access Memory), the data processing speed is being progressively increased as a result of increasing requirements arising from raising the operating frequency (clock rate). As a result, the access time for an individual memory cell access is increasingly being shortened. At the same time, it is still necessary to ensure that a defined minimum time interval, in which a row line has to be activated in order to read or write a data signal, is maintained. This minimum time interval is generally physically necessitated, for example as a result of the length of the row line and the capacitive load connected thereto.

A precharging operation is normally initiated by applying a so-called precharge command, which, for example, is applied before or during a row access. In this case, it is basically possible for this precharge command to lead to a premature precharge, that is to say the relevant row line is precharged before the minimum time intervals has elapsed. If this minimum activation time interval of one of the row lines is violated, this can lead to a data loss during the reading or writing of a data signal.

SUMMARY OF THE INVENTION

It is accordingly an object of the invention to provide a memory configuration which overcomes the above-mentioned disadvantages of the heretofore-known memory configurations of this general type and in which it is ensured that a minimum activation time interval of a row line is maintained during the reading or writing of a data signal, irrespective of when a row line is activated and/or how long a read operation or write operation lasts.

In addition, it is an object of the invention to provide a method of operating an integrated memory that ensures that the minimum activation time interval of a row line is maintained during the reading or writing of a data signal.

With the foregoing and other objects in view there is provided, in accordance with the invention, a memory configuration, including:

an integrated memory having a memory cell array with memory cells, column lines, and row lines;

the memory cells being connected to respective ones of the row lines for selecting one of the memory cells and being connected to respective ones of the column lines for one of reading and writing a data signal;

a row access controller operatively connected to the memory cell array, the row access controller activating one of the row lines for selecting one of the memory cells, and the row access controller controlling a precharging operation for precharging one of the row lines;

a control unit having a first input, a second input, a third input, and an output;

a first terminal for providing a decoded precharge command initiating a triggering of a precharging operation of one of the row lines, the first terminal being connected the first input of the control unit;

a second terminal for providing a signal indicating that a read operation or a write operation for a data signal has been finished, the second terminal being connected the second input of the control unit;

a third terminal for providing a signal containing information about a time interval during which an activated one of the row lines is activated, the third terminal being connected to the third input of the control unit; and the output of the control unit being connected to the row access controller and outputting an output signal for triggering a precharging operation of one of the row lines.

In other words, the object of the invention is achieved by an integrated memory of the type described above having a control unit including a first input, which is connected to a signal terminal for a decoded precharge command, which initiates the triggering of the precharging operation of one of the row lines; a second input, which is connected to a signal terminal for a signal which indicates that the reading or writing of a data signal has been finished; a third input, which is connected to a signal terminal for a signal which contains information about a time interval during which an activated row line is activated; and an output which is connected to the row access controller in order to output an output signal to trigger the precharging operation of one of the row lines.

According to another feature of the invention, a central control device is connected to the first input and the second input of the control unit for controlling a memory cell access.

According to yet another feature of the invention, the row access controller is connected to the third input of the control unit.

According to another feature of the invention, a fourth terminal provides an address signal for addressing one of the row lines, and the control unit is connected to the fourth terminal and includes a storage circuit for storing address signals of row lines to be selected.

According to a further feature of the invention, the storage circuit includes a shift register. The shift register serially reads, in response to a respective precharge command, address signals of given ones of the row lines to be selected in a given sequence, the shift register outputs the address signals of the given ones of the row lines to be selected in the given sequence, and the control unit triggers, with the output signal from the output of the control unit, a precharging operation of one of the row lines in accordance with the address signals output by the shift register.

According to another feature of the invention, the integrated memory is a synchronous memory having a clock terminal for receiving a clock signal.

According to another feature of the invention, a synchronization circuit is connected upstream of the third input of the control unit for time-synchronizing the signal containing the information about the time interval with the clock signal.

With the objects of the invention in view there is also provided, a method of operating an integrated memory, the method includes the steps of:

providing an integrated memory having a memory cell array with memory cells, column lines, and row lines, the memory cells being connected to respective ones of the row lines for selecting one of the memory cells and being connected to respective ones of the column lines for reading or writing a data signal;

providing a row access controller for activating one of the row lines to select one of the memory cells and for controlling a precharging operation to precharge one of the row lines;

applying a precharge command for a given row line to be activated to a terminal of the integrated memory, the precharge command initiating a triggering of the precharging operation;

activating, with the row access controller, the given row line for selecting one of the memory cells;

performing an operation selected from the group consisting of reading a data signal from a selected memory cell and writing a data signal to a selected memory cell;

triggering, with the row access controller, the precharging operation for the given row line when the operation selected from the group consisting of reading a data signal and writing a data signal is finished and when a given time interval, during which the given row line must at least be activated, has elapsed since activating the given row line; and precharging the given row line subsequent to triggering the precharging operation.

In other words, the object of the invention relating to the method is achieved by a method of operating an integrated memory of the type mentioned at the beginning having the features:

a precharge command for a row line to be activated is applied to a terminal of the memory and initiates the triggering of the precharging operation, the row line to be activated is activated by the row access controller to select one of the memory cells, a data signal of a selected memory cell is read from the memory cell or written to the memory cell, the precharging operation for the activated row line is triggered by the row access controller when the reading or writing of the data signal has been finished and when a defined time interval, during which the row line must at least be activated, has elapsed since the activation, and the activated row line is precharged after the triggering of the precharging operation.

Another mode of the invention includes the steps of applying a plurality of precharge commands for precharging respective row lines one after another, storing addresses of the respective row lines to be precharged, and using the addresses stored in the storing step for defining a sequence for precharging the respective row lines.

Yet another mode of the invention includes the steps of combining the memory cells into row units each including several of the row lines, applying a precharge command for a given row unit of memory cells to be activated, activating the given row unit for selecting one of the memory cells included in the given row unit, triggering a precharging operation for the given row unit activated with the activating step when the operation selected from the group consisting of reading a data signal and writing a data signal is finished and when a time interval, during which the given row unit must at least be activated, has elapsed since activating the given row unit, and precharging the given row unit activated with the activating step subsequent to triggering the precharging operation.

With the objects of the invention in view there is also provided, a method of operating an integrated memory, the method includes the steps of:

providing an integrated memory having a memory cell array with memory cells combined to row units each including several of the memory cells;

providing a row access controller for activating a given row unit to select one of the memory cells and for controlling a precharging operation to precharge the given row unit;

applying a precharge command for the given row unit to be activated to a terminal of the integrated memory, the precharge command initiating a triggering of the precharging operation;

activating, with the row access controller, the given row unit for selecting one of the memory cells included in the given row unit;

performing an operation selected from the group consisting of a read operation and a write operation;

triggering the precharging operation for the given row unit activated with the activating step when the operation selected from the group consisting of a read operation and a write operation is finished and when a time interval, during which the given row unit must at least be activated, has elapsed since activating the given row unit; and precharging the given row unit activated with the activating step subsequent to triggering the precharging operation.

The invention ensures that a minimum activation time interval of a row line to be activated is maintained during the reading or writing of a data signal. This is because the precharging operation for the activated row line is triggered only when, after a complete memory cell access, the minimum activation time interval has elapsed. This means that, after the reading or writing, the precharging of the row line waits until the activation time interval has elapsed, irrespective of how long the read operation or write operation lasts. Furthermore, the precharging waits until the reading or writing of the data signal has been finished, irrespective of when the corresponding row line is activated. A precharging operation of an activated row line is advantageously performed in a self-adjusting way.

The invention can advantageously be applied in a synchronous memory which has a terminal for a clock signal which is used as the operating frequency of the synchronous memory. The self-adjusting control of the precharging operation after the end of a read or write operation avoids, for example, a safety margin of, for example, two clock periods having to be introduced in order that the minimum activation time interval is not violated. As a result, with an increase in operating frequency and with increasing complexity of the requirements on the integrated memory, the bandwidth of the data to be processed would be severely restricted. The invention makes it possible to wait with the precharging until the analog activation time interval has elapsed, so that precharging operation can be triggered immediately in the subsequent clock period.

In one embodiment of the method according to the invention, a plurality of precharge commands for precharging respective row lines are applied one after another. In this case it is possible that, given different activation times of the respective row lines to be activated, a different sequence of precharging operations of the respective row lines can occur. For this reason, addresses of the row lines to be precharged are stored, the stored addresses being used to define a sequence in which the respective row lines are to be precharged.

In one embodiment of the integrated memory, the control unit is connected to a terminal for an address signal for addressing one of the row lines. The control unit contains a storage circuit for storing address signals of row lines to be selected.

In a preferred embodiment of the memory according to the invention, the storage circuit has a shift register, through the use of which the address signals of a plurality of row lines to be selected are read serially as a result of a respective precharge command. In this case, the address signals are output in the same sequence as when reading the address signals. In order that the appropriate row line can be precharged by the row access controller, the output signal triggers a precharging operation of a corresponding row line in accordance with the address signals output by the shift register. Therefore, using the address signal, a precharging operation of the corresponding row line is triggered by the row access controller.

The activation time interval during which an activated row line is activated is, for example, defined by the row access controller. As a result, in one embodiment of the memory according to the invention, the third input of the control unit is connected to the row access controller. The control unit is therefore supplied, from the row access controller, with an item of information through the use of which a precharging time of a selected row line after a read or write operation is determined.

In a further embodiment of the memory according to the invention, the memory has a central control device for controlling a memory cell access. The central control device is connected to the first and second input of the control unit. This means that the decoded precharge command and the signal which indicates that the reading or writing of a data signal has been finished is supplied to the control unit by the central control device. The central control device additionally controls, for example, the reading or the writing of a data signal of the selected memory cell.

In a further embodiment of the invention, the memory cells are combined to form row units, which each contain a plurality of row lines. Therefore, in each case one of the row units is activated to select one of the memory cells and, correspondingly, a precharging operation is in each case carried out for one of the row units. To this end, a precharge command for a row unit of memory cells to be activated is applied accordingly to a terminal of the memory, for example the first input of the control unit. The precharging operation for the activated row unit is triggered when the reading or writing of the data signal has been finished and when the minimum time interval during which the row unit has at least to the activated has elapsed since the activation. The row units of the memory cells are, for example, memory areas, which are referred to as memory banks.

The invention can be applied to a plurality of types of integrated memories, each of which has row lines to select memory cells for the reading or writing of data signals.

Other features which are considered as characteristic for the invention are set forth in the appended claims.

Although the invention is illustrated and described herein as embodied in an integrated memory with row access control to activate and precharge row lines, and a method of operating such a memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of an embodiment of the integrated memory according to the invention;

FIG. 2 is a detailed block diagram of an embodiment of the integrated memory according to the invention.

DESCRIPTION OF THE PREFERRED EMBODIMENTS

Figure 3:
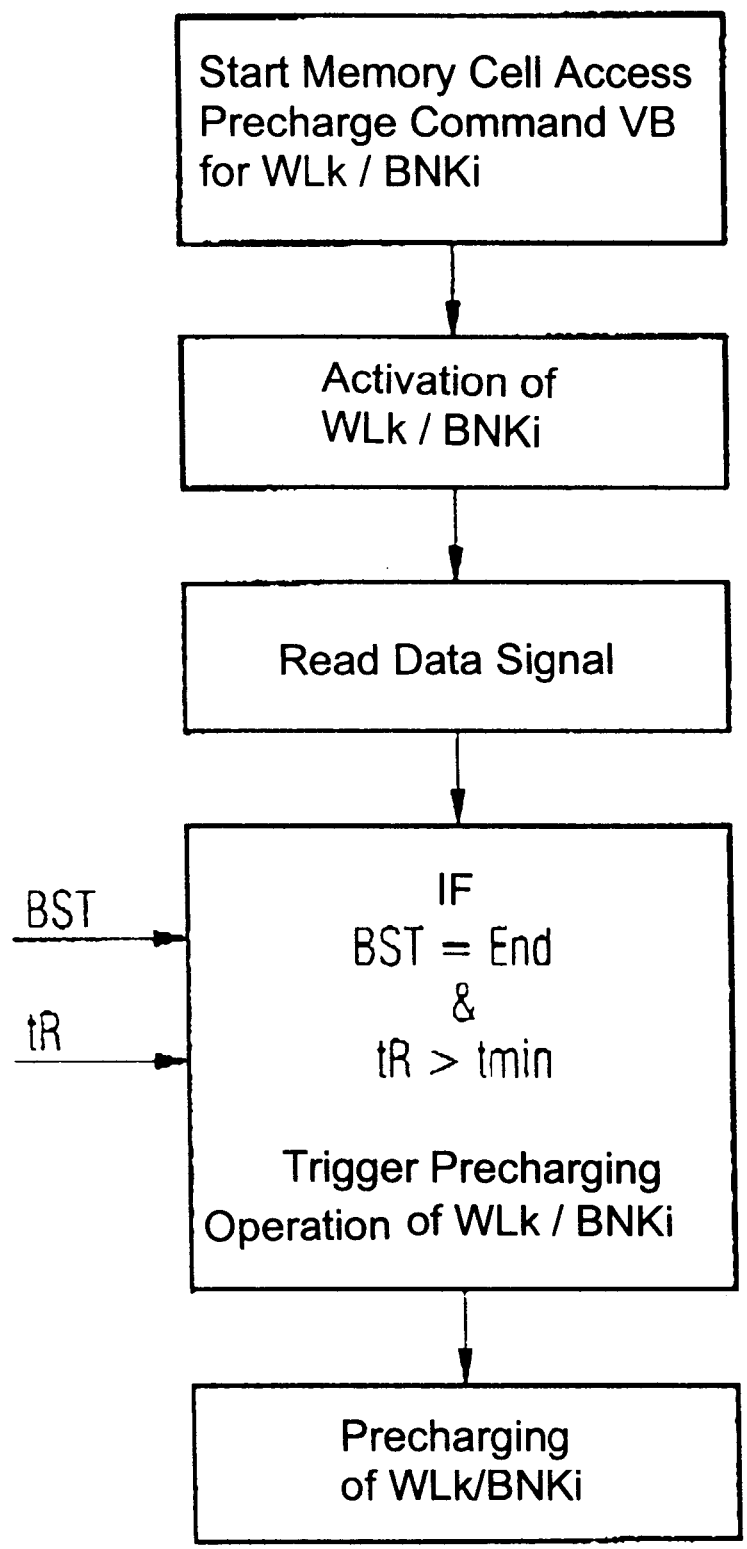
FIG. 3 is a flow diagram illustrating the method according to the invention.

Referring now to the figures of the drawings in detail and first, particularly, to FIG. 1 thereof, there is shown an embodiment of the integrated memory, which has a memory cell array 5 which has column lines BL and row lines WL. The memory cells MC are provided at crossing points of the column lines BL and row lines WL. In addition, the memory cells MC are each connected to one of the row lines WL to select one of the memory cells MC. If the memory cells have, for example, a storage capacitor and a select transistor, then the row lines WL are each connected to control terminals of the corresponding select transistors of the memory cells MC. In order to read or write a data signal DA, a corresponding memory cell MC is connected to one of the column lines BL. The action of reading or writing the data signal DA is, for example, controlled via a column access controller 3.

In addition, the memory has a row access controller 2 to activate one of the row lines WL to select one of the memory cells MC. The row access controller 2 is additionally used to control a precharging operation to precharge one of the row lines WL. In one embodiment, the row lines WL can be combined to form row units or memory banks BNK.

In order to carry out a memory cell access, the address ADR of a memory cell to be selected is applied to a central control device 4. The latter is used to control the memory cell access. The row line addressed is activated by the row access controller 2. Through the use of addressing the corresponding column line, the memory cell to be selected is selected, and its data signal DA is read or written via the column access controller 3. In order to control a memory cell access of this type, the row access controller 2 and the column access controller 3 are connected to the central control device 4.

FIG. 3 shows a flow diagram for carrying out an exemplary operating method. At the beginning of a memory cell access, a so-called burst command is applied, for example, to the central control device 4, which triggers a memory cell access and, in addition, contains a precharge command VB ("auto pre-charge") for the relevant row line WLk or the relevant row unit BNKi (memory bank). As a result of the application of the precharge command VB, triggering of the precharging operation is initiated. In a further step, the row line WLk to be activated or row unit BNKi is activated by the row access controller 2 to select one of the memory cells MC. The data signal DA to be read from the selected memory cell is subsequently read from the memory cell.

In order that a precharging operation of the activated row line WLk or the row unit BNKi can be triggered, two conditions must be met. Firstly, the reading of the data signal must have been finished. This is indicated by the signal BST which, for example, is generated by the central control unit 4 according to FIG. 1. In addition, a defined time interval tmin must have elapsed, during which the activated row line WLk or row unit BNKi must at least be activated (minimum activation time interval of a row line or row unit). This depends, for example, on the respective length of the row lines or their respective capacitive loads. The information relating to the activation time interval of the activated row line WLk is transmitted by the signal tR. As soon as the signal tR indicates that the time interval during which the activated row line WLk or row unit BNKi is activated is greater than the minimum activation time interval tmin, a corresponding precharging operation of the activated row line WLk or row unit BNKi is triggered. The activated row line WLk or row unit BNKi is precharged to the precharge potential VP after the triggering of the precharging operation.

In order to control an operating method of this type, the integrated memory according to FIG. 1 has a control unit 1. The latter has a first input 11, which is connected to the signal terminal for the decoded precharge command VB. In this embodiment, the precharge command VB is generated by the central control device 4. The latter is therefore connected to the first input 11 of the control unit 1. A second input 12 of the control unit 1 is connected to the signal terminal for the signal BST. In this embodiment, the latter is likewise generated by the central control device 4 which, to this end, is connected to the second input 12 of the control unit 1. The control unit 1 also has a third input 13, which is connected to the signal terminal for the signal tR. In the exemplary embodiment illustrated, the signal tR, which contains information about the time interval during which the activated row line WLk is activated, is generated by the row access controller 2. The row access controller 2 is therefore connected to the third input 13 of the control unit 1. The control unit also has an output 14, which is connected to the row access controller 2. The output 14 is used to output the output signal A, which triggers a precharging operation of one of the activated row lines WLk by the row access controller 2.

FIG. 2 shows a more detailed embodiment of the integrated memory according to the invention. The control unit 1 contains a storage circuit 20 to store address signals RADR of row lines WL to be selected or row units BNK to be selected. To this end, the control unit 1 is connected to a terminal for the address signal RADR for the addressing.

In an operating method, for example, a plurality of precharge commands VB for precharging respective row lines WLk or row units BNKi are applied one after another. The addresses RADR of the row lines to be precharged or row units to be precharged are then stored in the storage circuit 20. It is then possible, by using the stored addresses RADR, to define a sequence in which the respective row lines WLk or row units BNKi are to be precharged.

In this example, let it be assumed for simplicity that the memory has four row units or memory banks BNK. A 2-bit address signal RADR therefore has to be transmitted. The signal RADR contains an item of information about which of the four memory banks is used for a memory cell access.

In this example, the storage unit 20 contains a shift register 21, through the use of which the address signals RADR of a plurality of row lines WLk or row units BNKi to be selected are read in serially as a result of a respective precharge command VB. The decoded precharge command VB is in this case used as an input strobe signal for the shift register 21.

The shift register 21 is, for example, a "FIFO" (First In First Out) memory. Upon each precharge command VB, the associated address signal RADR is clocked into the shift register 21. The output strobe signal used is the signal BST, which indicates the end of the respective read or write operation. During each output strobe signal BST, that memory bank BNKi which has just finished a read or write operation is transmitted to the controller 10. This means that the address signals RADR stored in the shift register 21 are output in the same sequence as they were read in. In this case, it is assumed that the time durations of the individual read or write operations (so-called burst length) for each memory cell access are equally long.

Since, in this example, the memory has four memory banks BNK, there is also a four-phase signal tR present. In this case, connected upstream of the third input 13 of the control unit 1 is a synchronization circuit 6 for the time synchronization of the signal tR with the clock signal clk of the integrated memory, which is configured here as a synchronous memory. This means that the four part-signals of the signal tR are synchronized with the clock signal clk for further use. Using the synchronized signal tR and the address signals RADR read from the storage circuit 20, the output signal A for triggering a precharging operation of one of the four memory banks BNKi is generated in the controller 10. Since, for each of the four memory banks BNKi there is a dedicated row access controller, there therefore exists a four-phase output signal A to trigger a respective precharging operation. A part-signal of the output signal A finally triggers a precharging operation for a corresponding memory bank BNKi.

We claim:

1. A memory configuration, comprising:
   an integrated memory having a memory cell array with memory cells, column lines, and row lines;
   said memory cells being connected to respective ones of said row lines for selecting one of said memory cells and being connected to respective ones of said column lines for one of reading and writing a data signal;
   a row access controller operatively connected to said memory cell array, said row access controller activating one of said row lines for selecting one of said memory cells, and said row access controller controlling a precharging operation for precharging one of said row lines;
   a control unit having a first input, a second input, a third input, and an output;
   a first terminal for providing a decoded precharge command initiating a triggering of a precharging operation of one of said row lines, said first terminal being connected said first input of said control unit;

a second terminal for providing a signal indicating that one of a read operation and a write operation for a data signal has been finished, said second terminal being connected said second input of said control unit;

a third terminal for providing a signal containing information about a time interval during which an activated one of said row lines is activated, said third terminal being connected to said third input of said control unit; and said output of said control unit being connected to said row access controller and outputting an output signal for triggering a precharging operation of one of said row lines.

2. The memory configuration according to claim 1, including a central control device connected to said first input and said second input of said control unit for controlling a memory cell access.

3. The memory configuration according to claim 1, wherein said row access controller is connected to said third input of said control unit.

4. The memory configuration according to claim 2, wherein said row access controller is connected to said third input of said control unit.

5. The memory configuration according to claim 1, including:

a fourth terminal for providing an address signal for addressing one of said row lines; and said control unit being connected to said fourth terminal and including a storage circuit for storing address signals of row lines to be selected.

6. The memory configuration according to claim 5, wherein:

said storage circuit includes a shift register;

said shift register serially reads, in response to a respective precharge command, address signals of given ones of said row lines to be selected in a given sequence;

said shift register outputs the address signals of said given ones of said row lines to be selected in the given sequence; and said control unit triggers, with the output signal from said output of said control unit, a precharging operation of one of said row lines in accordance with the address signals output by said shift register.

7. The memory configuration according to claim 1, wherein said integrated memory is a synchronous memory having a clock terminal for receiving a clock signal.

8. The memory configuration according to claim 7, including a synchronization circuit connected upstream of said third input of said control unit for time-synchronizing the signal containing the information about the time interval with the clock signal.

9. A method of operating an integrated memory, the method which comprises:

providing an integrated memory having a memory cell array with memory cells, column lines, and row lines, the memory cells being connected to respective ones of the row lines for selecting one of the memory cells and being connected to respective ones of the column lines for one of reading and writing a data signal;

providing a row access controller for activating one of the row lines to select one of the memory cells and for controlling a precharging operation to precharge one of the row lines;

applying a precharge command for a given row line to be activated to a terminal of the integrated memory, the precharge command initiating a triggering of the precharging operation;

activating, with the row access controller, the given row line for selecting one of the memory cells;

performing an operation selected from the group consisting of reading a data signal from a selected memory cell and writing a data signal to a selected memory cell;

triggering, with the row access controller, the precharging operation for the given row line when the operation selected from the group consisting of reading a data signal and writing a data signal is finished and when a given time interval, during which the given row line must at least be activated, has elapsed since activating the given row line; and precharging the given row line subsequent to triggering the precharging operation.

10. The method according to claim 9, which comprises:

applying a plurality of precharge commands for precharging respective row lines one after another;

storing addresses of the respective row lines to be precharged; and using the addresses stored in the storing step for defining a sequence for precharging the respective row lines.

11. The method according to claim 9, which comprises:

combining the memory cells into row units each including several of the row lines;

applying a precharge command for a given row unit of memory cells to be activated;

activating the given row unit for selecting one of the memory cells included in the given row unit;

triggering a precharging operation for the given row unit activated with the activating step when the operation selected from the group consisting of reading a data signal and writing a data signal is finished and when a time interval, during which the given row unit must at least be activated, has elapsed since activating the given row unit; and precharging the given row unit activated with the activating step subsequent to triggering the precharging operation.

12. A method of operating an integrated memory, the method which comprises:

providing an integrated memory having a memory cell array with memory cells combined to row units each including several of the memory cells;

providing a row access controller for activating a given row unit to select one of the memory cells and for controlling a precharging operation to precharge the given row unit;

applying a precharge command for the given row unit to be activated to a terminal of the integrated memory, the precharge command initiating a triggering of the precharging operation;

activating, with the row access controller, the given row unit for selecting one of the memory cells included in the given row unit;

performing an operation selected from the group consisting of a read operation and a write operation;

triggering the precharging operation for the given row unit activated with the activating step when the operation selected from the group consisting of a read operation and a write operation is finished and when a time interval, during which the given row unit must at least be activated, has elapsed since activating the given row unit; and precharging the given row unit activated with the activating step subsequent to triggering the precharging operation.

* * * * *